(12) United States Patent
Cok

(10) Patent No.: US 6,936,964 B2
(45) Date of Patent: Aug. 30, 2005

(54) OLED LAMP

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 265 days.

(21) Appl. No.: 10/260,353

(22) Filed: Sep. 30, 2002

(65) Prior Publication Data

US 2004/0061439 A1 Apr. 1, 2004

(51) Int. Cl.$^7$ .............................. H05B 33/00; H01J 9/00
(52) U.S. Cl. ...................... 313/512; 313/504; 313/506; 313/113; 428/917; 445/25; 427/69
(58) Field of Search ................. 313/512, 504, 313/506, 113, 114; 315/169.3; 482/917; 445/24, 25; 427/58, 64, 69

(56) References Cited

U.S. PATENT DOCUMENTS

| | | | | |
|---|---|---|---|---|
| 4,137,481 A | * | 1/1979 | Hilsum et al. ............... | 313/503 |
| 4,767,679 A | * | 8/1988 | Kawachi .................... | 428/690 |
| 5,276,380 A | | 1/1994 | Tang | |
| 6,168,289 B1 | | 1/2001 | Shah | |
| 6,181,062 B1 | * | 1/2001 | Hiraishi et al. ............. | 313/504 |
| 6,198,217 B1 | * | 3/2001 | Suzuki et al. ............... | 313/504 |
| 6,563,262 B1 | * | 5/2003 | Cao ........................... | 313/506 |
| 6,787,994 B2 | * | 9/2004 | Cok ........................... | 313/512 |
| 2002/0068191 A1 | * | 6/2002 | Kobayashi .................. | 428/690 |
| 2002/0074938 A1 | * | 6/2002 | Gu ............................. | 313/512 |
| 2003/0057829 A1 | * | 3/2003 | Ellens et al. ................ | 313/512 |

FOREIGN PATENT DOCUMENTS

| | | |
|---|---|---|
| EP | 0 732 868 B1 | 5/2000 |
| EP | 1 120 838 A2 | 8/2001 |
| WO | 99/57945 | 11/1999 |

* cited by examiner

Primary Examiner—Ashok Patel
(74) Attorney, Agent, or Firm—Andrew J. Anderson; Thomas H. Close

(57) ABSTRACT

An OLED lamp includes a substrate; a non-pixellated OLED formed on the substrate, the OLED including a first electrode formed on the substrate and extending from a first edge of the substrate toward a second opposite edge of the substrate, an OLED light emitting structure formed on top of the first electrode, leaving exposed a portion of the first electrode near the first edge of the substrate, and a second electrode formed over the OLED light emitting structure and extending to the second edge of the substrate; and an encapsulating cover located over the non-pixellated OLED, leaving exposed portions of the first electrode and the second electrode for making electrical contact to the lamp.

41 Claims, 4 Drawing Sheets

OLED LAMP

FIELD OF THE INVENTION

The present invention relates to the use of organic light emitting diodes (OLEDs) for area illumination and, more particularly, to the structure and method of manufacture of OLED area illumination lamps.

BACKGROUND OF THE INVENTION

Solid-state lighting devices employing light emitting diodes (LEDs) are increasingly useful for applications requiring robustness and long-life. For example, solid-state LEDs are found today in automotive applications. These devices are typically formed by combining multiple, small point-source LEDs into a single module together with glass lenses suitably designed to control the light as is desired for a particular application; see for example, WO99/57945, published Nov. 11, 1999. These multiple devices are expensive and complex to manufacture and integrate into single area illumination devices. Moreover, conventional LEDs provide point sources of light, a plurality of which are employed for area illumination.

Organic light emitting diodes (OLEDs) are manufactured by depositing organic semiconductor materials between electrodes on a substrate. This process enables the creation of light sources having extended surface area on a single substrate. The prior art describes the use of electro-luminescent materials as adjuncts to conventional lighting; for example U.S. Pat. No. 6,168,282, issued Jan. 2, 2001 to Chien. In this case, because of the limited light output from the electro-luminescent material, electro-luminescent devices are not useful for primary lighting. EP1120838A2, published Aug. 1, 2001 describes a method for mounting multiple organic light emitting devices on a mounting substrate to create an area illumination light source. However, this approach of mounting multiple light sources on a substrate increases the complexity and hence the manufacturing costs of the area illumination light source.

There is a need therefore for an improved, solid-state flat-panel area illumination device providing robust illumination with high brightness and a simplified manufacturing process.

SUMMARY OF THE INVENTION

The need is met according to the present invention by providing an OLED lamp including a substrate; a non-pixellated OLED formed on the substrate, the OLED including a first electrode formed on the substrate and extending from a first edge of the substrate toward a second opposite edge of the substrate, an OLED light emitting structure formed on top of the first electrode, leaving exposed a portion of the first electrode near the first edge of the substrate, and a second electrode formed over the OLED light emitting structure and extending to the second edge of the substrate; and an encapsulating cover located over the non-pixellated OLED, leaving exposed portions of the first electrode and the second electrode for making electrical contact to the lamp.

ADVANTAGES

The present invention has the advantage of providing an inexpensive, simple to manufacture area OLED illumination source with high brightness.

It will be understood that the figures are not to scale since the individual layers are too thin and the thickness differences of various layers too great to permit depiction to scale.

DETAILED DESCRIPTION OF THE INVENTION

Figure 1:
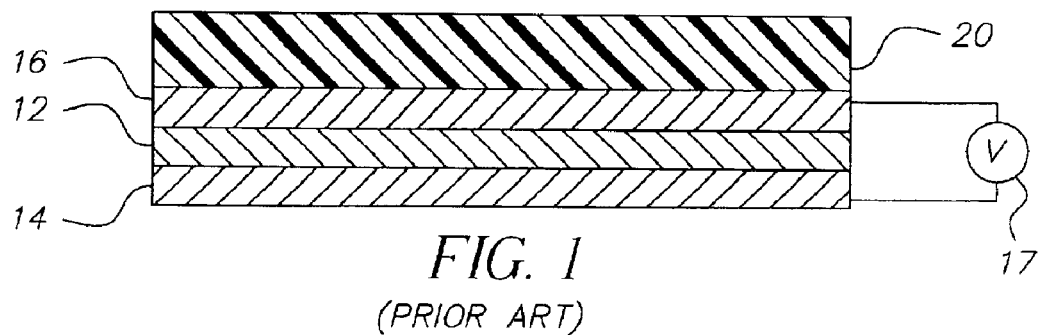
FIG. 1 illustrates a partial cross section of a prior art OLED.

FIG. 1 is a schematic diagram of a prior art OLED including an organic light emitting layer 12 disposed between two electrodes 14 and 16, e.g. a cathode and an anode, respectively. The organic light emitting structure 12 includes multiple layers in a structure and emits light upon application of a voltage from a power source 17 across the electrodes. The OLED light emitter typically includes a substrate 20 such as glass or plastic. It will be understood that the relative locations of the anode and cathode may be reversed with respect to the substrate 20 if the structure of the multiple layers of the organic light emitting layer 12 is likewise reversed.

Figure 2:
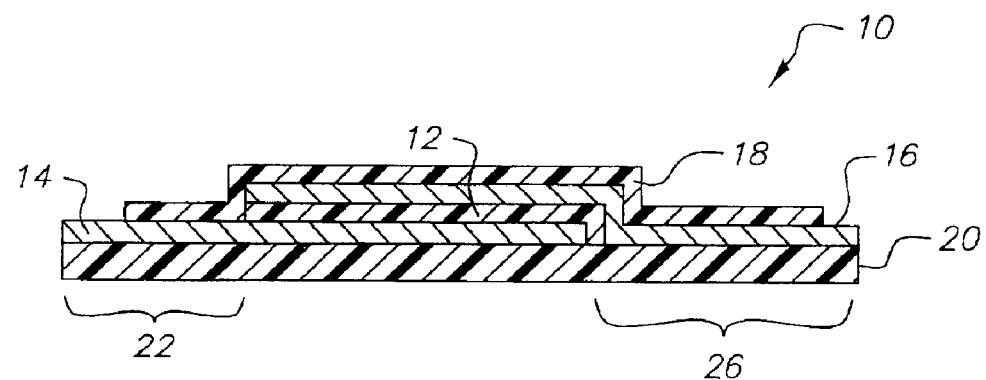
FIG. 2 is a cross section of an OLED lamp according to one embodiment of the present invention.

Referring to FIG. 2, according to one embodiment of the present invention, an OLED lamp 10 includes a substrate 20; a non-pixellated OLED formed on the substrate, the OLED including a first electrode 14 formed on the substrate and extending from a first edge 22 of the substrate toward a second opposite edge 26 of the substrate 20. The first electrode may, but does not necessarily extend all the way to the first edge of the substrate 20. An OLED light emitting structure 12 is formed on top of the first electrode 14, leaving exposed a portion of the first electrode near the first edge 22 of the substrate. A second electrode 16 is formed over the OLED light emitting structure 12 and extends toward the second edge 26 of the substrate. The second electrode may, but does not necessarily extend all the way to the second edge of the substrate. An encapsulating cover 18 is located over the non-pixellated OLED, leaving exposed portions of the first electrode 14 and the second electrode 16 for making electrical contact to the lamp. The encapsulating cover 18 may be a coated layer, or a hermetically sealed cover and may extend all the way to the edges 22 and 26 but must expose at least a part of the electrodes 14 and 16 so that electrical contact may be made to the electrodes. As used herein, the term "non-pixellated" means that the OLED light emitting layer and first and second electrodes are continuous over an extended region of the substrate and are not divided into many small sub-sections or pixels that can be independently activated to form an image. The OLED lamp having the structure described above lends itself readily to manufacture on a continuous assembly line, since the layers can be applied to a moving substrate by linear sources at a series of deposition stations that are arranged orthogonally to the direction of travel of the substrate past the stations. Because of the simple structure, there is a limited need for masking the substrate at the respective stations, and suitable masking may be accomplished with fixed masks that are a part of the deposition stations.

In operation, the OLED lamp of the present invention is powered by providing connectors from the exposed electrodes 14 and 16 on the left and right sides of the portions 22 and 26 to a power supply (not shown). Upon application of power, current passes through the electrodes, under the encapsulating cover 18, and the OLED light emitting structure 12 to generate light.

The present invention can be extended to include multiple stacked OLED light emitting structures 12. The use of multiple stacked OLED structures increases the total light output by a factor of the number of structures but will also increase the current requirement of the OLED lamp 10. The number of OLED light emitting structures can be increased until the practical current carrying capacities of the electrodes 14 and 16 are reached or until the imperfect transparency of the electrodes 14 and 16 or the OLED light emitting layer 12 make further layers impractical.

Figure 3:
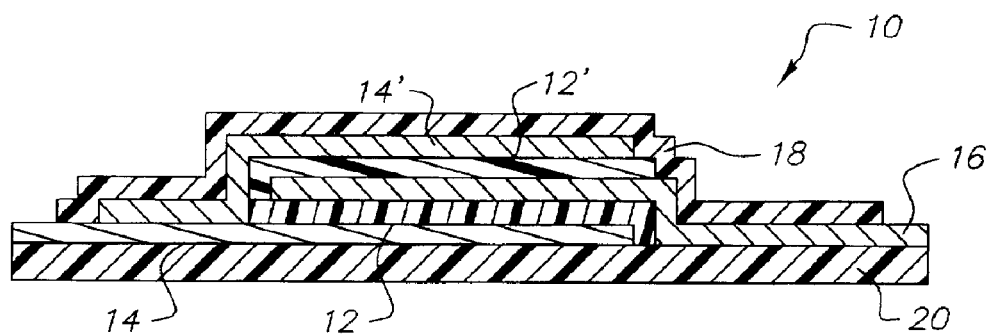
FIG. 3 is a cross section of an OLED lamp according to a further embodiment of the present invention.
Figure 4:
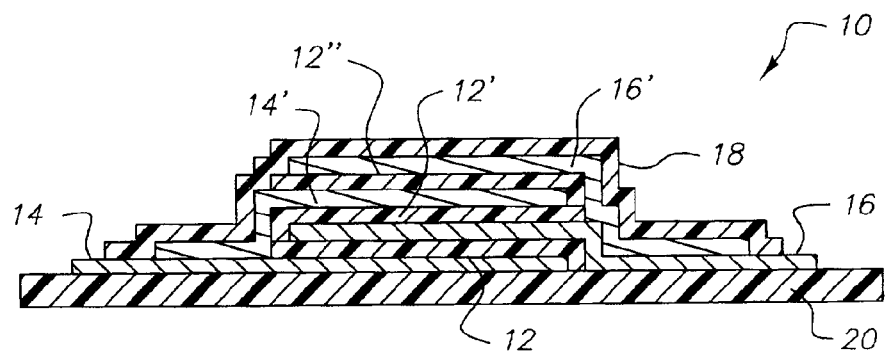
FIG. 4 is a cross section of an OLED lamp according to yet another embodiment of the present invention.

Referring to FIG. 3, in a multilayer OLED lamp, a second OLED light emitting structure 12' is located above the second electrode 16. A third electrode 14', in electrical contact with the first electrode 14, is located above the second OLED light emitting structure 12' and the multiple layers are encapsulated as in FIG. 2 with a cover 18. This multilayer arrangement can be extended to more layers as shown in FIG. 4. Referring to FIG. 4, a third OLED light emitting structure 12" is deposited above the third electrode 14'. A fourth electrode 16', electrically connected with the second electrode 16 is located above the third OLED light emitting structure 12". An encapsulating cover 18 is located above the fourth electrode 16'. This process of repeatedly locating OLED light emitting structures 12 between alternating electrode pairs 14 and 16, the respective electrodes in the pairs being connected in common, can be arbitrarily extended. For operation with Direct Current, the polarity of the OLED light emitting structures are alternated from one structure to the next so that all of the OLED structures emit light simultaneously. In this arrangement, the OLED layers are electrically connected in parallel, with the OLEDs all aligned in the same direction. This arrangement has the advantage that if one of the OLED light emitting structures fails open, the others may continue to operate. The directionality of the light output from the OLED lamp is not affected by the polarity of the OLED light emitting structure.

If an OLED lamp having the above described arrangement is driven with alternating current, the OLED light emitting structures will all simultaneously emit light only every half cycle of the alternating current. This can result in substantial flicker. A way of reducing flicker is to arrange the polarity of the OLED light emitting structures so that some of them emit light during each half cycle of the alternating current. This is achieved by constructing all of the OLED light emitting structures identically in the stack. This arrangement has the same advantage that if one of the OLED structures fails open, the others may continue to operate. It has been observed that driving with alternating current has the additional advantage of prolonging the lifetime of the OLED lamp.

The color temperature of the multilayer OLED lamp may be tailored by selecting the materials used in the OLED light emitting structures to emit light of different colors.

As described, the light source 10 will normally emit light through both the substrate 20 and the encapsulating cover 18. In an alternative embodiment of the present invention, a reflective layer may be provided on either the substrate 20 or the encapsulating cover 18 to direct the light through either the encapsulating cover or the substrate, respectively, so that the light source emits light from only one side, thereby controlling the directionality of the light source. Alternatively, either the electrode deposited upon the substrate or the electrode next to the encapsulating cover may be reflective.

Figure 5:
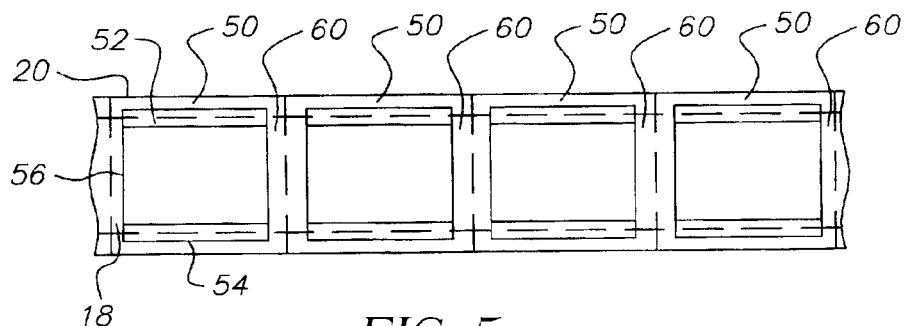
FIGS. 5 and 5A are top views of webs having a plurality of OLED lamps according to embodiments of the present invention.
Figure 6:
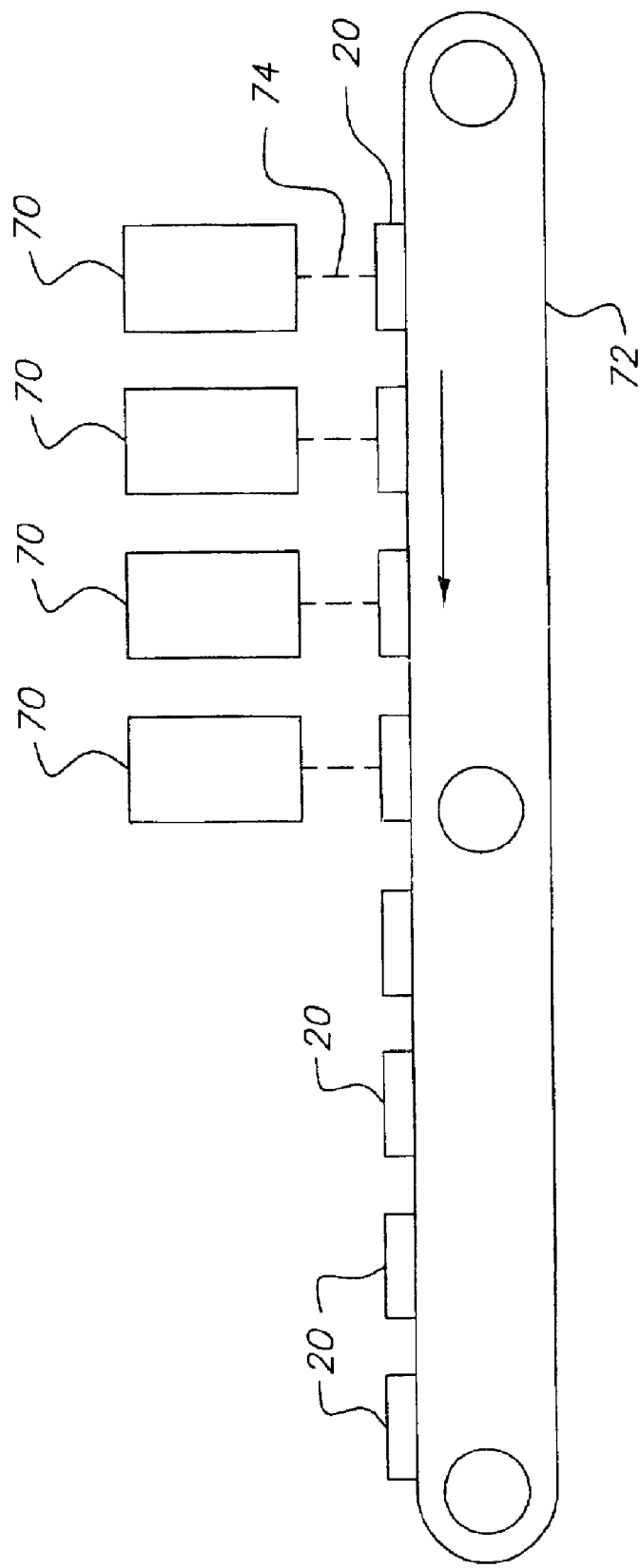
FIG. 6 is a schematic diagram illustrating a method of making an OLED lamp according to the present invention.

Referring to FIGS. 5 and 6, the present invention is particularly well suited to a simple manufacturing process. By providing deposition devices that deposit materials on only the left and central, central, or central and right portions of the substrate, a simple manufacturing process may be constructed. As shown in FIG. 6, multiple deposition stations 70 may be arranged along a web transport 72 to sequentially deposit materials 74 on the substrates 20 to sequentially create a series of OLED lamps.

The present invention may be applied in a continuous web process where the OLED lamps are formed on a continuous web substrate. Individual OLED lamps are formed on the substrate by periodically interrupting the deposition of the electrodes and the light emitting materials as shown in FIG. 5. The deposition of the encapsulating cover material may be continuous, and individual OLED lamps 56 may be separated from the continuous substrate 50 by cutting the substrate between the OLED lamps. The separation 60 between the lamps may be provided by score or perforation lines, and the individual lamps may remain connected until just prior to use, when they may be manually or mechanically separated from a stack or roll by tearing along the score or perforation lines. Thus, a plurality of the lamps may be economically and conveniently provided in an accordion folded stack, or in a roll, from which individual lamps may be removed for use.

An advantage of the present invention is that only very limited masking is necessary to achieve adequate deposition within the regions. For example the encapsulating coating can be applied in a continuous ribbon, leaving exposed portions 52 and 54 of the electrodes 14 and 16 respectively. Such masking can be achieved through many well known methods including, but not limited to, through-mask deposition, integral shadow masking, for example, as described in U.S. Pat. No. 5,276,380 and EP 0 732 868, laser ablation, and selective chemical vapor deposition. Generally, a simple shadow mask to obscure the regions where deposition is not meant to occur suffices. Linear deposition sources having deposition slits arranged perpendicularly to the direction of travel of the substrate(s) may be employed to deposit the materials as is known in the prior art. The encapsulating cover may be applied for example by known coating technologies.

Figure 5A:
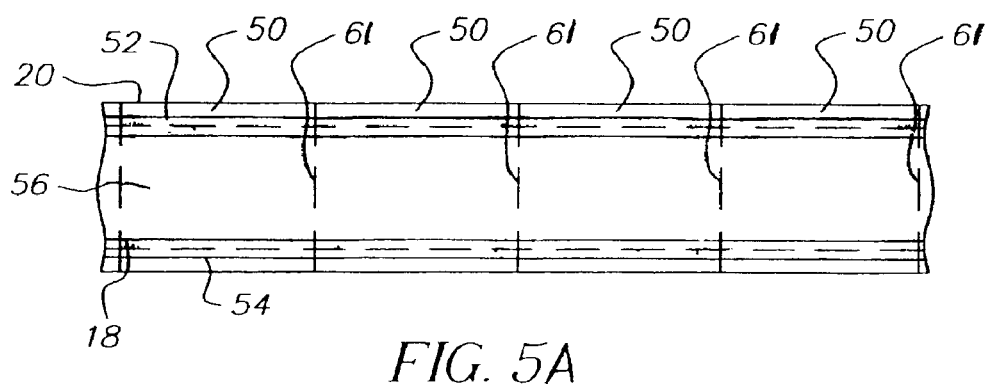

Alternatively, as shown in FIG. 5A, the layers of the OLED lamp may be continuously deposited on a web, and the individual lamps 56 cut from the web along lines 61. In this case, the layers of the OLED lamps will extend all the way to the edges of each lamp in the direction of transport of the web. In the illustrated embodiment, the cut substrates will be rectangular, with the electrodes and OLED light emitting layer extending to opposite edges of each cut substrate in a direction orthogonal to the first and second edges with exposed portions 52, 54 or the electrodes. The exposed opposite edges of the substrates cut from the web may be sealed, for example by dipping the edges in the same material used to form the encapsulating cover, thus encapsulating cover around the opposite edges.

The substrate 20 can be either rigid or flexible. Rigid substrates, such as glass, provide more structural strength and are generally planar but the present invention may also be used with a flexible substrate, such as plastic, that can be bent into a variety of shapes.

The present invention has the added advantage that the light source has a compact planar configuration enabling efficient storage, packing, and shipping.

The present invention may be employed in a wide variety of conventional applications, for example in a table-top lamp, floor-lamp, or chandelier. Alternatively, the invention may be employed as a flat-panel illumination device for a conventional suspended ceiling. The present invention may also be employed in portable illumination devices using DC power sources.

In a preferred embodiment, the OLED light emitting structure 12 is composed of small molecule or polymeric OLED materials as disclosed in but not limited to U.S. Pat. No. 4,769,292, issued Sep. 6, 1988 to Tang et al., and U.S. Pat. No. 5,061,569, issued Oct. 29, 1991 to VanSlyke et al.

General OLED Layer Architecture

Figure 7:
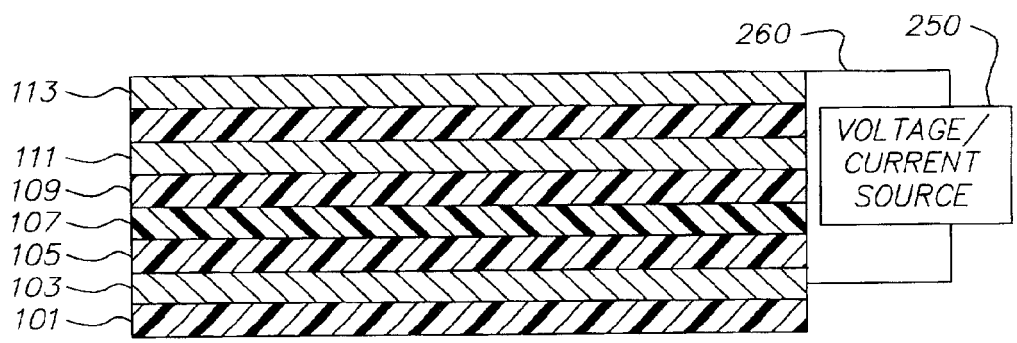
FIG. 7 is a schematic cross sectional diagram of a prior art OLED.

There are numerous configurations of the layers wherein the present invention can be successfully practiced. A typical structure is shown in FIG. 7 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or reflective, depending on the intended direction of light emission.. Transparent glass or plastic is commonly employed in such cases. For applications where the EL emission is through the top electrode, the transmissive characteristic of the bottom support is immaterial, and therefore can be light transmissive or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is only through the cathode electrode, the transmissive characteristics of anode are immaterial and any conductive material can be used, transparent or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4'-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the band-gap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608, 287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by evaporation, sputtering, or chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20,020,025,419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, providing anti-glare or anti-reflection coatings over the lamp, providing a polarizing medium over the lamp, or providing colored, neutral density, or color conversion filters over the lamp. Filters, polarizers, and anti-glare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

| PARTS LIST | |
|---|---|
| 10 | OLED lamp |
| 12 | organic light emitting structure |
| 12' | second organic light emitting structure |
| 12" | third organic light emitting structure |
| 14 | first electrode |
| 14' | third electrode |
| 16 | second electrode |
| 16' | fourth electrode |
| 17 | power source |
| 18 | encapsulating cover |
| 20 | substrate |
| 22 | first edge of substrate |
| 26 | opposite edge of substrate |
| 50 | continuous web |
| 52 | edge |
| 54 | opposite edge |
| 56 | single OLED lamp |
| 60 | web potions between OLED lamps |
| 70 | deposition station |
| 72 | web transport |
| 74 | materials |
| 101 | substrate |
| 103 | anode |
| 105 | hole-injecting layer |
| 107 | hole-transporting layer |
| 109 | light-emitting layer |
| 111 | electron-transporting layer |
| 113 | cathode layer |
| 250 | voltage/current source |
| 260 | conductive wiring |

What is claimed is:

1. An OLED lamp, comprising:

a) a substrate;

b) a non-pixellated OLED formed on the substrate, the OLED including i) a first electrode formed on the substrate and extending from a first edge of the substrate toward a second opposite edge of the substrate, ii) an OLED light emitting structure formed on top of the first electrode, leaving exposed a portion of the first electrode near the first edge of the substrate, and iii) a second electrode formed over the OLED light emitting structure and extending to the second edge of the substrate; wherein the first and second electrodes and OLED light emitting structure extend along the substrate in the direction of the first and second edges; and c) an encapsulating cover located over the non-pixellated OLED, leaving exposed portions of the first electrode and the second electrode for making electrical contact to the lamp.

2. The OLED lamp claimed in claim 1, wherein the substrate is rigid glass.

3. The OLED lamp claimed in claim 1, wherein the substrate is flexible.

4. The OLED lamp claimed in claim 1, wherein the encapsulating cover is a rigid cover.

5. The OLED lamp claimed in claim 1, wherein the encapsulating cover is a coated layer.

6. The OLED lamp claimed in claim 1, wherein the substrate is rectangular, the electrodes and the OLED light emitting layer extend to opposite edges of the substrate in a direction orthogonal to the first and second edges, and the encapsulating cover extends around the opposite edges.

7. The OLED lamp claimed in claim 1, wherein the substrate, the electrodes and the encapsulating cover are transparent.

8. The OLED lamp claimed in claim 1, further comprising a second non-pixellated OLED formed on an opposite side of the substrate and an encapsulating cover located over the second non-pixellated OLED.

9. The OLED lamp claimed in claim 1, further comprising a reflective layer for directing light from one side of the substrate.

10. An OLED lamp, comprising:
    a) a substrate;
    b) a non-pixellated OLED formed on the substrate, the OLED including
        i) a first electrode formed on the substrate and extending from a first edge of the substrate toward a second opposite edge of the substrate,
        ii) an OLED light emitting structure formed on top of the first electrode, leaving exposed a portion of the first electrode near the first edge of the substrate,
        iii) a second electrode formed over the OLED light emitting structure and extending to the second edge of the substrate,
        iv) a second OLED light emitting structure formed on top of the second electrode and located over the first OLED light emitting structure, and
        v) a third electrode formed over the second OLED light emitting structure and electrically connected to the first electrode; and
    c) an encapsulating cover located over the non-pixellated OLED, leaving exposed portions of the first electrode and the second electrode for making electrical contact to the lamp.

11. The OLED lamp claimed in claim 10, wherein the non-pixellated OLED further comprises:
    vi) a third OLED light emitting structure formed on top of the third electrode and located over the second OLED light emitting structure; and
    vii) a fourth electrode formed over the third OLED light emitting structure and electrically connected to the second electrode.

12. An OLED lamp, comprising:
    a) a substrate;
    b) a non-pixellated OLED formed on the substrate, the OLED including
        i) a plurality of electrically connected first electrodes extending from a first edge of the substrate toward a second opposite edge of the substrate,
        ii) a plurality of electrically connected second electrodes extending to the second edge of the substrate
        iii) a plurality of stacked OLED light emitting structures located between respective pairs of first and second electrodes; and
    c) an encapsulating cover located over the non-pixellated OLED, leaving exposed portions of a first electrode and a second electrode for making electrical contact to the lamp.

13. The OLED lamp claimed in claim 12, wherein the orientations of the OLED light emitting structures in the stack alternate, whereby when the OLED lamp is driven with an AC power source, flicker is reduced.

14. A method of making an OLED lamp of claim 1, comprising the steps of:
    a) providing a substrate;
    b) forming a first electrode on the substrate extending from a first edge of the substrate toward a second opposite edge of the substrate;
    c) forming a non-pixellated OLED light emitting structure on top of the first electrode, leaving exposed a portion of the first electrode near the first edge of the substrate;
    d) forming a second electrode over the OLED light emitting structure extending to the second edge of the substrate; wherein the first and second electrodes and OLED light emitting structure extend along the substrate in the direction of the first and second edges; and
    e) locating an encapsulating cover over the first electrode, the OLED light emitting structure, and the second electrode, leaving exposed portions of the first electrode and the second electrode for making electrical contact to the lamp.

15. The method claimed in claim 14, wherein the substrate is carried on a conveyor through a succession of stations where the fist electrode, the OLED light emitting structure, the second electrode, and the encapsulating cover are applied in succession to the substrate.

16. The method claimed in claim 15, wherein the first and second electrodes and the OLED light emitting structure are formed by vapor deposition and the encapsulating cover is formed by coating.

17. The method claimed in claim 15, wherein the substrate is a continuous web that is passed through a succession of stations where the first electrode, the OLED light emitting structure, the second electrode, and the encapsulating cover are applied in succession to the substrate.

18. The method claimed in claim 17, wherein the first and second electrodes and the OLED light emitting structure are formed by vapor deposition and the encapsulating cover is formed by coating.

19. The method claimed in claim 14, further comprising the steps of:
    d1) forming a second OLED light emitting structure on top of the second electrode and located over the first OLED light emitting structure; and
    d2) forming a third electrode over the second OLED light emitting structure and electrically connected to the first electrode.

20. The method claimed in claim 19, further comprising the steps of:
    d3) forming a third OLED light emitting structure on top of the third electrode and located over the second OLED light emitting structure; and
    d4) forming a fourth electrode formed over the third OLED light emitting structure and electrically connected to the second electrode.

21. The method claimed in claim 14, wherein the substrate is rigid glass.

22. The method claimed in claim 14, wherein the substrate is flexible.

23. The method claimed in claim 14, wherein the encapsulating cover is a rigid cover.

24. The method claimed in claim 14, wherein the encapsulating cover is a coated layer.

25. The method claimed in claim 14, wherein the substrate is rectangular, the electrodes and the OLED light emitting layer extend to opposite edges of the substrate in a direction orthogonal to the first and second edges, and the encapsulating cover extends around the opposite edges.

26. The method claimed in claim 14, wherein the substrate, the electrodes and the encapsulating cover are transparent.

27. The method claimed in claim 14, further comprising the step of forming a second non-pixellated OLED on an opposite side of the substrate and locating an encapsulating cover over the second non-pixellated OLED.

28. The method claimed in claim 14, further comprising the step of providing a reflective layer for directing light from one side of the substrate.

29. The method claimed in claim 14, wherein the substrate is a web, and further comprising the steps of forming a plurality of OLED lamps in succession on the web, and separating individual OLED lamps from the web.

30. The method claimed in claim 29, wherein the first electrode, the OLED light emitting structure, and the second electrode are deposited continuously over the substrate by a linear source.

31. The method claimed in claim 29, wherein the encapsulating cover is coated.

32. The method claimed in claim 29, wherein the formation of the first and second electrodes and light emitting structure is periodically interrupted to form two-dimensional rectangles of deposited material that can be cut into separate lamps.

33. The method claimed in claim 32, wherein the encapsulating cover is formed as a continuous coating along a longitudinal direction of the web.

34. A method of making an OLED lamp of claim 12, comprising the steps of:
  a) providing a substrate;
  b) forming a non-pixellated OLED on the substrate, the OLED including:
    i) a plurality of electrically connected first electrodes extending from a first edge of the substrate toward a second opposite edge of the substrate,
    ii) a plurality of electrically connected second electrodes extending to the second edge of the substrate,
    iii) a plurality of stacked OLED light emitting structures located between respective pairs of first and second electrodes; and
  c) locating an encapsulating cover over the non-pixellated OLED, leaving exposed portions of a first electrode and a second electrode for making electrical contact to the lamp.

35. The method claimed in claim 34, wherein the substrate is a web, and further comprising the steps of forming a plurality of OLED lamps in succession on the web.

36. The method claimed in claim 35, further comprising the step of separating individual OLED lamps from the web.

37. The method claimed in claim 35, further comprising the step of perforating the web between the OLED lamps.

38. The method claimed in claim 34, wherein the first electrode, the OLED light emitting structure, and the second electrode are deposited continuously over the substrate by a linear source.

39. The method claimed in claim 34, wherein the encapsulating cover is coated.

40. The method claimed in claim 35, wherein the formation of the first and second electrodes and light emitting structure is periodically interrupted to form two-dimensional rectangles of deposited material that can be cut into separate lamps.

41. The method claimed in claim 35, wherein the encapsulating cover is formed as a continuous coating along a longitudinal direction of the web.

* * * * *